(12) United States Patent
Won et al.

(10) Patent No.: US 7,453,300 B2
(45) Date of Patent: Nov. 18, 2008

(54) MTCMOS FLIP-FLOP, CIRCUIT INCLUDING THE MTCMOS FLIP-FLOP, AND METHOD OF FORMING THE MTCMOS FLIP-FLOP

(75) Inventors: Hyo-sig Won, Suwon-si (KR); Kwangok Jeong, Suwon-si (KR); Young-hwan Kim, Pohang-si (KR); Bong-hyun Lee, Pohang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 74 days.

(21) Appl. No.: 11/097,235

(22) Filed: Apr. 4, 2005

(65) Prior Publication Data

US 2005/0242862 A1   Nov. 3, 2005

(30) Foreign Application Priority Data

Apr. 29, 2004   (KR) ............... 10-2004-0029853

(51) Int. Cl.
*H03K 3/00*   (2006.01)
(52) U.S. Cl. .................... 327/218; 327/203
(58) Field of Classification Search ......... 327/202–218, 327/291
See application file for complete search history.

(56) References Cited

U.S. PATENT DOCUMENTS

| | | | |
|---|---|---|---|
| 3,862,440 A | 1/1975 | Suzuki et al. | |
| 4,849,658 A | 7/1989 | Iwamura et al. | |
| 5,115,150 A | 5/1992 | Ludwig | |
| 5,486,774 A | 1/1996 | Douseki et al. | |
| 5,982,211 A | 11/1999 | Ko | |
| 6,097,230 A * | 8/2000 | Bareither | 327/202 |
| 6,107,700 A | 8/2000 | Ishikawa et al. | |
| 6,181,180 B1 | 1/2001 | Chen et al. | |
| 6,246,265 B1 | 6/2001 | Ogawa | |
| 6,492,854 B1 | 12/2002 | Ku et al. | |
| 6,538,471 B1 | 3/2003 | Stan et al. | |
| 6,577,153 B2 | 6/2003 | Kodama | |
| 6,724,231 B2 * | 4/2004 | Yoshikawa | 327/291 |
| 6,870,412 B2 * | 3/2005 | Cho | 327/202 |
| 6,919,739 B2 | 7/2005 | Ngo | |

(Continued)

FOREIGN PATENT DOCUMENTS

JP           00228145 A      9/1996

(Continued)

OTHER PUBLICATIONS

Calhoun, Benton H., et al., A Leakage Reduction Methodology for Distributed MTCMOS, IEEE Journal of Solid-State Circuits, May 2004, pp. 818-826, vol. 39—No. 5.

(Continued)

*Primary Examiner*—Quan Tra
(74) *Attorney, Agent, or Firm*—Volentine & Whitt, PLLC

(57) ABSTRACT

A multi-threshold voltage complementary metal oxide semiconductor (MTCMOS) flip-flop, a circuit including the MTCMOS flip-flop, and a method of forming the MTCMOS flip-flop are disclosed. The MTCMOS flip-flop breaks a leakage current path during a sleep mode to retain an output data signal. The MTCMOS flip-flop typically further uses a data feedback unit to retain the output data signal.

32 Claims, 8 Drawing Sheets

U.S. PATENT DOCUMENTS

| | | | |
|---|---|---|---|
| 6,972,605 B1 * | 12/2005 | Choe | 327/200 |
| 6,998,895 B2 | 2/2006 | Uvieghara | |
| 7,049,871 B2 * | 5/2006 | Tohsche | 327/197 |
| 2006/0076987 A1 | 4/2006 | Won | |

FOREIGN PATENT DOCUMENTS

| | | |
|---|---|---|
| JP | 1998-056373 A | 2/1998 |
| JP | 00305249 A0 | 10/2002 |
| KR | 1020050077921 A | 8/2005 |

OTHER PUBLICATIONS

Wei, Liqiong, et al., Low Voltage Low Power CMOS Design Techniques for Deep Submicron ICs, visid., p. 24, 13th International Conference on VLSI Design, 2000.

* cited by examiner

MTCMOS FLIP-FLOP, CIRCUIT INCLUDING THE MTCMOS FLIP-FLOP, AND METHOD OF FORMING THE MTCMOS FLIP-FLOP

BACKGROUND OF THE INVENTION

1. Field of the Invention

The present invention relates generally to a semiconductor integrated circuit. More particularly, the present invention relates to a multi-threshold voltage complementary metal oxide semiconductor (MTCMOS) flip-flop, a circuit including the MTCMOS, and a method of fabricating the MTCMOS flip-flop.

A claim of priority is made to Korean Patent Application No. 10-2004-0029853 filed on Apr. 29, 2004, the disclosure of which is incorporated herein by reference in its entirety.

2. Description of the Related Art

Flip-flops are typically used as a data memory elements in digital circuits such as semiconductor integrated circuits. A flip-flop samples an input signal at a particular instant in time determined by a clock signal and converts the input signal into an output signal. Flip-flops are commonly used in semiconductor memory devices such as dynamic random access memory (DRAM) devices, processors, computers, etc.

FIG. 1 is a circuit diagram of conventional complementary metal oxide semiconductor (CMOS) hybrid-latch flip-flop disclosed in U.S. Pat. No. 6,181,180. Referring to FIG. 1, a conventional CMOS hybrid-latch flip-flop 100 includes positive channel metal oxide semiconductor (PMOS) transistors 101, 105, 106, and 107, negative channel metal oxide semiconductor (NMOS) transistors 102, 103, 104, 108, 109, and 110, a clock delay unit 120 including three inverters connected in series, and a latch unit 130 including cross-coupled inverters.

The following description relates to the operation of conventional CMOS hybrid-latch flip-flop 100. Where a clock signal CK has a logic level "low", PMOS transistor 101 is turned on. As a result, an internal node 140 is precharged to a logic level "high". NMOS transistors 104 and 110 are turned on whenever NMOS transistors 102 and 108 are turned off. Accordingly, an output node 150 generating an output data signal "Q" retains a previous value.

Where clock signal CK makes a transition from logic level "low" to logic level "high", PMOS transistor 101 is turned off and NMOS transistors 102 and 108 are turned on. NMOS transistors 104 and 110 remain turned on for a delay period of clock delay unit 120. An input data signal "D" is sampled within the delay period.

Where input data signal "D" has logic level "low", internal node 140 remains at logic level "high". Output node 150 is then discharged to logic level "low" via NMOS transistors 108, 109, and 110, which are in a turned-on state, and remains at logic level "low" due to latch unit 130. Where input data signal "D" has logic level "high", internal node 140 is discharged to logic level "low" via NMOS transistors 102, 103, and 104, which are in the turned-on state. Output node 150 is then charged to logic level "high" via PMOS transistor 107, which is in the turned-on state, and remains at logic level "high" due to latch unit 130.

FIG. 2 is a circuit diagram of a conventional CMOS semi-dynamic flip-flop disclosed in U.S. Pat. No. 6,181,180. Referring to FIG. 2, a conventional CMOS semi-dynamic flip-flop 200 includes PMOS transistors 201 and 205, NMOS transistors 202, 203, 204, 206, and 207, a clock delay unit 210 including two inverters connected in series, a NAND gate 220, an internal latch unit 230, and an output latch unit 240.

The following description relates to the operation of conventional CMOS semi-dynamic flip-flop 200. Where a clock signal CK is at logic level "low", PMOS transistor 201 is turned on. As a result, an internal node 250 is precharged to logic level "high" and remains at logic level "high" due to internal latch unit 230. Meanwhile, NMOS transistor 206 is in a turned-off state. Accordingly, an output node 260 having an output data signal "Q" retains a previous value.

Where clock signal CK makes a transition from logic level "low" to logic level "high" and where an input data signal "D" is at logic level "low", internal node 250 remains at logic level "high". As a result, NMOS transistors 206 and 207 are turned on. Accordingly, output node 260 is discharged to logic level "low" and remains at logic level "low" due to output latch unit 240. Where input data signal "D" is at logic level "high" and clock signal CK makes a transition from logic level "low" to logic level "high", NMOS transistors 203 and 204 are in the turned-on state and NMOS transistor 202 is in the turned-on state for a delay period of clock delay unit 210 and a delay period of NAND gate 220. As a result, internal node 250 is discharged to logic level "low". Internal node 250 then remains low due to internal latch unit 230, and therefore, PMOS transistor 205 is turned on. Accordingly, output node 260 is charged to logic level "high" and remains high due to output latch unit 240.

To increase the integration density of semiconductor devices, a lower-power semiconductor integrated circuits are increasingly needed. A drop in power supply voltage is generally effective in implementing a low-power semiconductor integrated circuit but it usually causes transistors to be slow. To overcome this problem, a MTCMOS circuit including a metal oxide semiconductor (MOS) transistor having a low threshold voltage and a MOS transistor having a high threshold voltage is used.

A MTCMOS circuit comprises a switch circuit between a logic circuit and each of a supply voltage VDD and a ground voltage GND. The switch circuit comprises transistors having a high threshold voltage. Where the logic circuit is operating, i.e., the logic circuit is in an active mode, the switch circuit is turned on and provides supply voltage VDD or ground voltage GND to the logic circuit including the transistors having a low threshold voltage. Meanwhile, where the logic circuit is not operating, i.e., the logic circuit is in a sleep mode, the switch circuit is turned off and breaks a voltage supplied to the logic circuit. Therefore, leakage current is reduced in the logic circuit, and power consumption is minimized in an entire system. Accordingly, MTCMOS technology is very useful in reducing power consumption in portable large scale integrated (LSI) circuits having a sleep mode period much longer than an active mode period. However, where a circuit using conventional MTCMOS technology is turned off, i.e., where the circuit is in sleep mode, data stored in a flip-flop or a latch included in the logic circuit is typically lost.

Meanwhile, where flip-flops 100 and 200 shown in FIGS. 1 and 2 are used in circuits employing conventional MTCMOS technology, the following problems occur. Where flip-flops 100 and 200 include transistors having only a high threshold voltage, the circuit operates slowly. Alternatively, where flip-flops 100 and 200 include transistors having only a low threshold voltage, a large leakage current occurs in flop-flops 100 and 200. As a result, output data signal "Q" is typically not retained where the circuit is in sleep mode. Accordingly, conventional flip-flops 100 and 200 can not be applied to the circuit without modifying their design.

SUMMARY OF THE INVENTION

The present invention provides a high-speed, low-power MTCMOS flip-flop capable of retaining an output data signal in a sleep mode.

The present invention also provides a MTCMOS circuit including the MTCMOS flip-flop.

The present invention also provides a method of generating the MTCMOS flip-flop using a CMOS flip-flop.

According to one embodiment of the present invention, a MTCMOS flip-flop comprises a first stage charging or discharging an internal node in response to an input data signal, a clock signal, and a sleep signal activated in a sleep mode. The MTCMOS flip-flop further comprises a second stage charging or discharging an output node in response to a signal apparent at the internal node, the clock signal, and a combination of the clock signal and the sleep signal, and storing an output data signal generated by charging or discharging the output node. The first stage or the second stage typically comprises a leakage break transistor which is turned off in response to the sleep signal being activated, thereby breaking a leakage current path during sleep mode.

According to another embodiment of the present invention, a MTCMOS flip-flop comprising a clock delay unit delaying a clock signal in an active mode in which a sleep signal is inactivated, the clock delay unit being inactivated in a sleep mode in which the sleep signal is activated. The MTCMOS flip-flop further comprises a first stage charging or discharging an internal node in response to an input data signal, the clock signal, and an output signal of the clock delay unit. The MTCMOS flip-flop still further comprises a second stage charging or discharging an output node in response to a signal apparent at the internal node, the clock signal, and the output signal of the clock delay unit, and storing an output data signal generated by charging or discharging the output node. The first or the second stage typically comprises a leakage break transistor which is turned off whenever the sleep signal is activated, thereby breaking a leakage current path during sleep mode.

According to still another embodiment of the present invention, a MTCMOS flip-flop comprises a first stage charging or discharging an internal node in response to an input data signal, a clock signal, and a sleep signal activated in a sleep mode, and storing a signal apparent at the internal node. The MTCMOS flip-flop further comprises a second stage charging or discharging an output node in response to the signal apparent at the internal node, the clock signal, the sleep signal, and an inverted sleep signal, and storing an output data signal apparent at the output node. The first or the second stage typically comprises a leakage break transistor which is turned off whenever the sleep signal is activated, thereby breaking a leakage current path during sleep mode.

According to still another embodiment of the present invention, a circuit having a MTCMOS flip-flop comprises an integrated circuit. The integrated circuit comprises a MTCMOS flip-flop sampling an input data signal in response to a clock signal and a sleep signal activated in a sleep mode, and generating and storing an output data signal. The integrated circuit further comprises a logic circuit performing a predetermined logic operation on the output data signal to generate an output signal. The integrated circuit still further comprises a switch circuit providing a real ground voltage to a virtual ground voltage connected to the MTCMOS flip-flop and the logic circuit, in response to an active signal activated in an active mode. The circuit having the MTCMOS flip-flop further comprises a leakage break transistor which is turned off whenever the sleep signal is activated, thereby breaking a leakage current path during sleep mode.

According to still another embodiment of the present invention, a method of forming a MTCMOS flip-flop comprises converting metal oxide semiconductor (MOS) transistors included in a complementary metal oxide semiconductor (CMOS) flip-flop to MOS transistors having a low threshold voltage. The method further comprises converting MOS transistors included in an output latch unit included in the CMOS flip-flop to MOS transistors having a high threshold voltage. The method further comprises converting a real ground voltage connected to the MOS transistors having the low threshold voltage to a virtual ground voltage. The method further comprises providing a sleep signal activated in a sleep mode to a MOS transistor included in a leakage current path to break the leakage current path.

Accordingly, since a MTCMOS flip-flop of the present invention breaks the leakage current path during sleep mode, it retains the output data signal. In addition, the MTCMOS flip-flop typically includes a special circuit such as the data feedback unit used to retain the output data signal.

The MTCMOS flip-flop of the present invention uses a smaller number of transistors than a balloon flip-flop and a complementary pass-transistor (CP) flip-flop used in conventional MTCMOS circuits. Moreover, the MTCMOS flip-flop of the present invention has a fast operating speed and a low power delay product. Accordingly, the MTCMOS flip-flop is readily used in high-speed, low-power circuits.

A MTCMOS circuit according to embodiments of the present invention includes a MTCMOS flip-flop adapted to retain stored data in sleep mode, thereby generating an effective output signal.

A method according to embodiments of the present invention generates a MTCMOS flip-flop adapted to retain the output data signal in sleep mode using a CMOS flip-flop. Therefore, the method is readily used in designing a MTCMOS circuit.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 3:
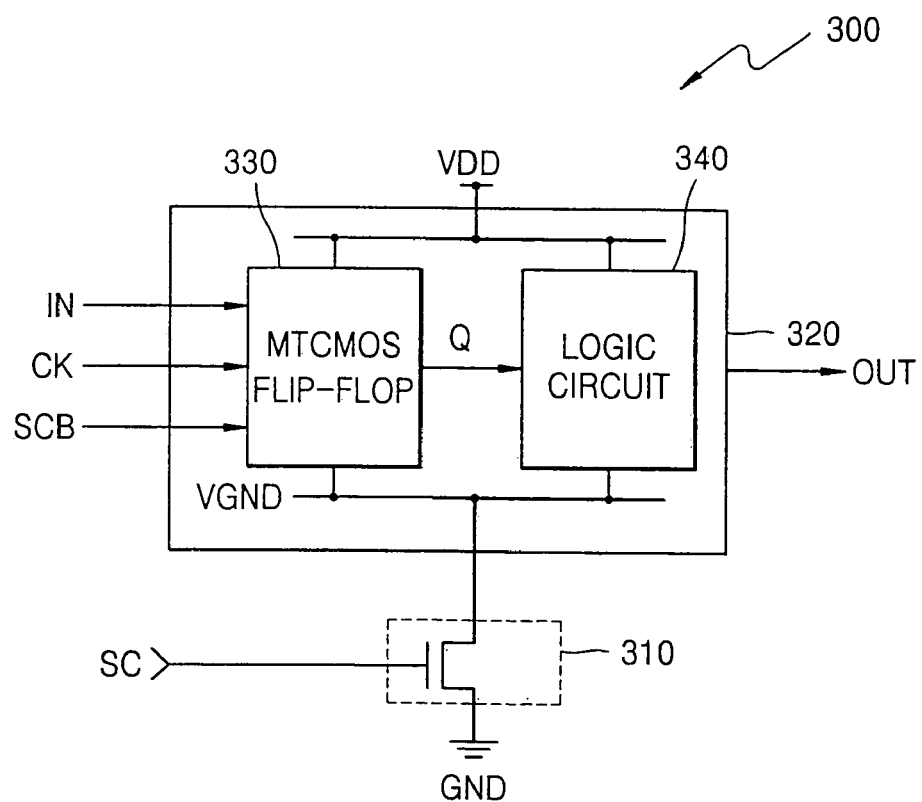
FIG. 3 is a block diagram of a circuit containing a MTCMOS flip-flop according to one embodiment of the present invention.

FIG. 3 is a block diagram of a circuit containing a MTCMOS flip-flop according to one embodiment of the present invention. Referring to FIG. 3, a circuit 300 comprises a switch circuit 310 and an integrated circuit 320. Circuit 300 switches between two modes of operation, namely a sleep mode and an active mode, in response to an active signal SC and a sleep signal SCB.

Switch circuit 310 includes at least one NMOS transistor having a high threshold voltage. The NMOS transistor has a source connected to a real ground voltage GND and is referred to as a sleep transistor. Switch circuit 310 is connected to a MTCMOS flip-flop 330 and a logic circuit 340 in circuit 300.

In response to active signal SC, switch circuit 310 connects or disconnects real ground voltage GND with a virtual ground voltage VGND connected to MTCMOS flip-flop 330 and logic circuit 340 in integrated circuit 320. Active signal SC switches to a first logic level (e.g., logic level "high") whenever circuit 300 is in active mode and switches to a second logic level (e.g., logic level "low") whenever circuit 300 is in sleep mode.

Integrated circuit 320 includes MTCMOS flip-flop 330 and logic circuit 340, which are connected between power supply voltage VDD and virtual ground voltage VGND. MTCMOS flip-flop 330 and logic circuit 340 include transistors having a low threshold voltage.

MTCMOS flip-flop 330 samples an input signal IN in response to a clock signal CK and sleep signal SCB, and stores and outputs an output data signal "Q". Input signal IN is typically an input data signal. Sleep signal SCB switches to the first logic level whenever circuit 300 is in sleep mode and switches to the second logic level whenever circuit 300 is in active mode.

According to one embodiment of the present invention, MTCMOS flip-flop 330 includes a leakage break transistor. The leakage break transistor is turned off whenever sleep signal SCB has the first logic level, thereby breaking a leakage current path during sleep mode. Therefore, MTCMOS flip-flop 330 is capable of retaining output data signal "Q" while in sleep mode.

In addition, MTCMOS flip-flop 330 typically includes an output latch unit storing output data signal "Q". The output latch unit typically includes cross-coupled inverters including transistors having the high threshold voltage. Accordingly, leakage current is prevented from changing the logic level of output data signal "Q" during sleep mode because a leakage current path through the output latch unit is readily broken. As a result, MTCMOS flip-flop 330 retains output data signal "Q" in sleep mode. A leakage current path through the output latch unit is referred to as a sneak leakage current path.

According to another embodiment of the present invention, MTCMOS flip-flop 330 includes an internal latch unit, an output latch unit, and a data feedback unit. The internal latch unit stores an inverted input data signal, i.e., an internal data signal, and includes cross-coupled inverters. The output latch unit stores an inverted internal data signal, i.e., output data signal "Q", and includes cross-coupled inverters. The data feedback unit is activated in response to sleep signal SCB and inverts output data signal "Q" to restore the internal data signal. Accordingly, MTCMOS flip-flop 330 prevents an internal node connected to the internal latch unit from floating, and therefore, retains output data signal "Q" in sleep mode.

The cross-coupled inverters included in the internal latch unit comprise transistors having the low threshold voltage while the cross-coupled inverters included in the output latch unit comprise transistors having the high threshold voltage. Accordingly, leakage current is prevented from changing the logic level of output data signal "Q" during sleep mode because the leakage current path through the output latch unit is readily broken. Therefore, MTCMOS flip-flop 330 retains output data signal "Q" in sleep mode.

Logic circuit 340 comprises a latch or a flip-flop that includes transistors having the low threshold voltage. Logic circuit 340 receives the output data signal "Q" stored in MTCMOS flip-flop 330 and performs a predetermined logic operation on output data signal "Q" to generate an output signal OUT.

Although not shown in FIG. 3, circuit 300 often further includes a switch circuit connected in series between real power supply voltage VDD and integrated circuit 320. The switch circuit connects or disconnects real power supply voltage VDD with a virtual power supply voltage (not shown) of integrated circuit 320 in response to active signal SC.

Figure 4:
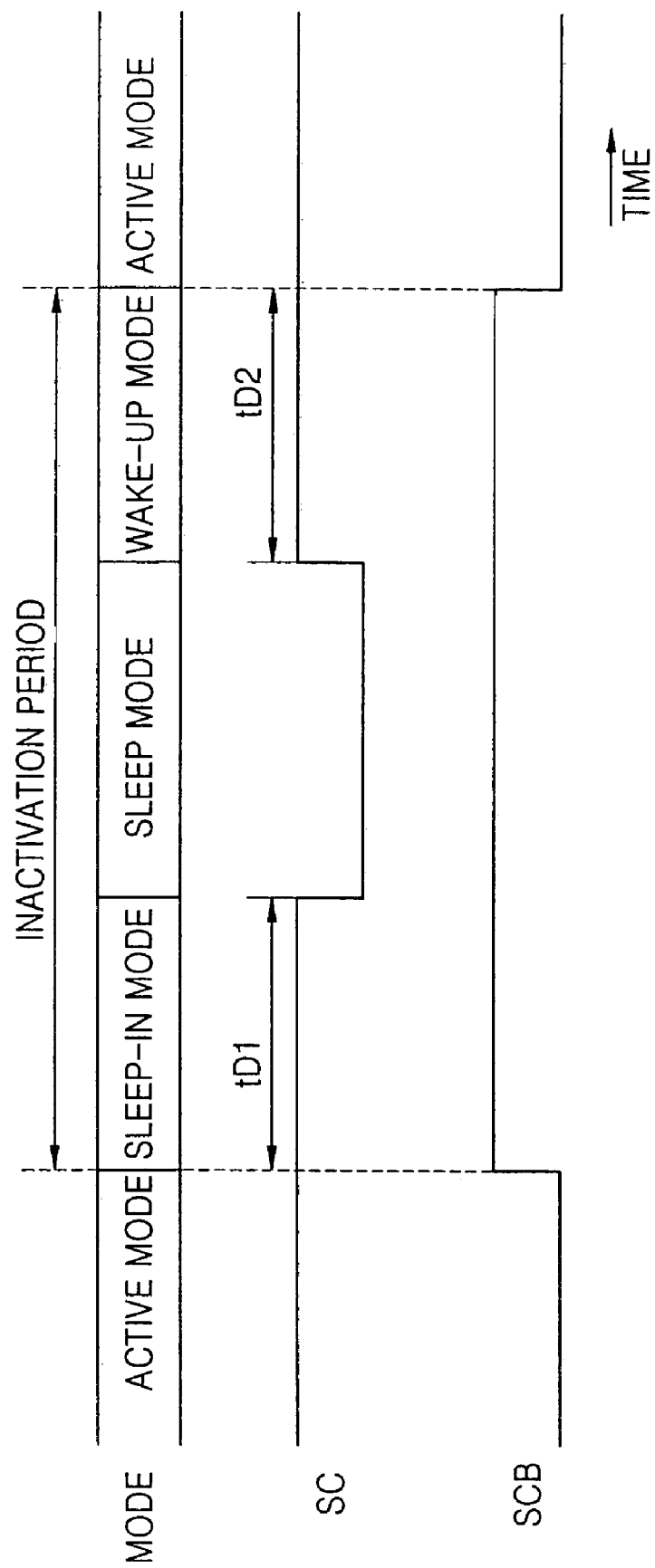
FIG. 4 illustrates operation mode switching based on an active signal and a sleep signal in the circuit shown in FIG. 3.

FIG. 4 illustrates operation mode switching based on active signal SC and sleep signal SCB in circuit 300 shown in FIG. 3. Referring to FIG. 4, circuit 300 shown in FIG. 3 typically operates sequentially in an active mode, a sleep-in mode, a sleep mode, a wake-up mode, and an active mode in response to active signal SC and sleep signal SCB. A period corresponding to the sleep-in mode, sleep mode, and the wake-up mode designates an inactivation period or a sleep period.

The following description relates to a process for switching circuit 300 from active mode to sleep mode. The switching process includes the sleep-in mode in which active signal SC and sleep signal SCB are switched to logic level "high". Sleep signal SCB transitions to logic level "high" a first delay time tD1 before active signal SC transitions from logic level "high" (i.e., an activated state) to logic level "low" (i.e., an inactivated state). First delay time tD1 is required to break new data arriving at MTCMOS flip-flop 330 and allow MTCMOS flip-flop 330 to store output data signal "Q" before circuit 300 enters sleep mode.

The following description relates to a process for switching circuit 300 from sleep mode to active mode. The switching process includes the wake-up mode in which active signal SC and sleep signal SCB are switched to logic level "high". Active signal SC is at logic level "high" a second delay time tD2 before sleep signal SCB transitions from logic level "high" (i.e., the activated state) to logic level "low" (i.e., the inactivated state). Second delay time tD2 is required to remove noise (or floating) from a virtual ground voltage node connected to MTCMOS flip-flop 330 by discharging the virtual ground voltage node. Second delay time tD2 is calculated using a resistive-capacitive (RC) time constant in semiconductor elements (i.e., switch circuit 310, MTCMOS flip-flop 330, and logic circuit 340) connected to virtual ground voltage VGND.

Figure 5:
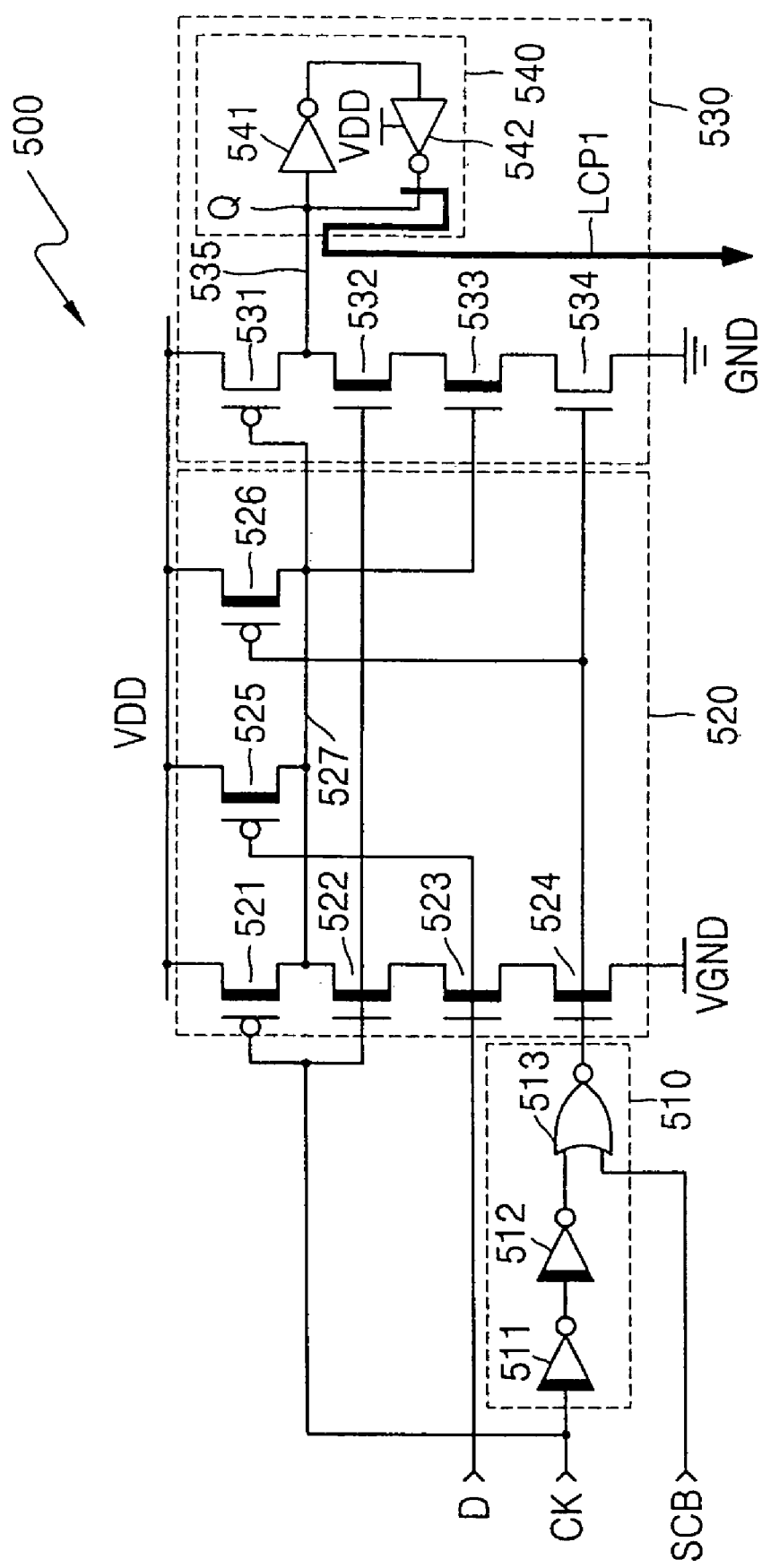
FIG. 5 is a circuit diagram of a MTCMOS flip-flop according to one embodiment of the present invention.

FIG. 5 is a circuit diagram of a MTCMOS flip-flop according to one embodiment of the present invention. The MTCMOS flip-flop shown in FIG. 5 is a MTCMOS hybrid-latch flip-flop.

Referring to FIG. 5, a MTCMOS hybrid-latch flip-flop 500 comprises a clock delay unit 510, a first stage 520, and a second stage 530. First stage 520 and second stage 530 are referred to as front and back stages, respectively. Clock delay unit 510 is typically included in first stage 520.

Clock delay unit 510 includes a first inverter 511 inverting clock signal CK, a second inverter 512 inverting an output signal of first inverter 512, and a NOR gate 513 performing a NOR operation on an output signal of second inverter 512 and sleep signal SCB. Inverters 511 and 512 include transistors (not shown) having the low threshold voltage. NOR gate 513 includes transistors (not shown) having the high threshold voltage.

Clock delay unit 510 delays clock signal CK in active mode where sleep signal SCB has logic level "low" and is inactivated in sleep mode where sleep signal SCB has logic level "high". In other words, in active mode where sleep signal SCB has logic level "low", clock delay unit 510 delays clock signal CK to generate an inverted clock signal. In sleep mode where sleep signal SCB has logic level "high", clock delay unit 510 is inactivated regardless of the logic level of clock signal CK and generates an output signal at logic level "low". In response to the output signal of clock delay unit 510 having logic level "low", leakage break transistors 524 and 534 included in first and second stages 520 and 530, respectively, are turned off. As a result, leakage break transistors 524 and 534 break the leakage current path during sleep mode.

First stage 520 is connected between real power supply voltage VDD and virtual ground voltage VGND. In response to an input data signal "D", the clock signal CK, and the output signal of the clock delay unit, first stage 520 charges or discharges an internal node 527. First stage 520 includes a charge path to charge internal node 527 to logic level "high" and a discharge path to discharge internal node 527 to logic level "low".

The charge path includes first, second, and third PMOS transistors 521, 525, and 526, which have the low threshold voltage. First PMOS transistor 521 has a source connected to real power supply voltage VDD, a gate connected to clock signal CK, and a drain connected to internal node 527. Second PMOS transistor 525 is connected in parallel with first PMOS transistor 521 and has a gate connected to input data signal "D". Third PMOS transistor 526 is connected in parallel with second PMOS transistor 525 and has a gate connected to the output signal of clock delay unit 510.

The discharge path includes leakage break transistor 524, which inactivates the discharge path in response to the output signal of clock delay unit 510 in sleep mode. Leakage break transistor 524 comprises a NMOS transistor having the low threshold voltage. One terminal of leakage break transistor 524 is connected to virtual ground voltage VGND. Leakage break transistor 524 is turned off where sleep signal SCB is activated and therefore breaks the leakage current path during sleep mode.

The discharge path further comprises first and second NMOS transistors 522 and 523, which have the low threshold voltage. First NMOS transistor 522 has a drain connected to internal node 527 and a gate connected to clock signal CK. Second NMOS transistor 523 is connected between first NMOS transistor 522 and leakage break transistor 524 and has a gate connected to input data signal "D".

Second stage 530 is connected between real power supply voltage VDD and real ground voltage GND. Second stage 530 charges or discharges an output node 535 in response to a signal apparent at internal node 527, clock signal CK, and the output signal of clock delay unit 510, and stores output data signal "Q" generated by charging or discharging output node 535.

Second stage 530 includes an output latch unit 540 storing output data signal "Q". Output latch unit 540 includes cross-coupled inverters 541 and 542. Transistors (not shown) included in cross-coupled inverters 541 and 542 have the high threshold voltage so that they break the leakage current path during sleep mode. Second stage 530 further includes a charge path for charging output node 535 to logic level "high" and a discharge path for discharging output node 535 to logic level "low".

The charge path includes a first leakage break transistor 531 gated with the signal apparent at internal node 527. First leakage break transistor 531 comprises a PMOS transistor having the high threshold voltage. Terminals of first leakage break transistor 531 are connected to real power supply voltage VDD and output node 535, respectively. First leakage break transistor 531 is turned off in sleep mode, thereby breaking the leakage current path during sleep mode.

The discharge path includes a second leakage break transistor 534 inactivating (i.e., breaking) the discharge path in response to the output signal of clock delay unit 510 in sleep mode. Second leakage break transistor 534 includes a NMOS transistor having the high threshold voltage. A terminal of second leakage break transistor 534 is connected to real ground voltage GND. Second leakage break transistor 534 is turned off as a result of sleep signal SCB being activated, thereby breaking the leakage current path during sleep mode.

The discharge path further includes first and second NMOS transistors 532 and 533. First NMOS transistor 532 has a drain connected to output node 535 and is gated with clock signal CK. Second NMOS transistor 533 is connected between first NMOS transistor 532 and second leakage break transistor 534 and is gated with the signal apparent at internal node 527. First and second NMOS transistors 532 and 533 have the low threshold voltage.

In FIG. 5, LCP1 denotes an example of the leakage current path that is broken during sleep mode. LCP1 is a sneak leakage current path connecting real power supply voltage VDD to real ground voltage GND via a PMOS transistor (not shown) included in inverter 542 and the NMOS transistors 532, 533, and 534 where output data signal "Q" is at logic level "high". Sneak leakage current path LCP1 is typically broken by turning off second leakage break transistor 534 in sleep mode.

As described above, MTCMOS hybrid-latch flip-flop 500 inactivates clock delay unit 510 using sleep signal SCB in order to break the leakage current path, thereby retaining output data signal "Q" while in sleep mode. In addition, MTCMOS hybrid-latch flip-flop 500 includes leakage break transistors 531 and 534 having the high threshold voltage to ensure that the leakage current path breaks. Accordingly, MTCMOS hybrid-latch flip-flop 500 retains output data signal "Q" in sleep mode.

Figure 1:
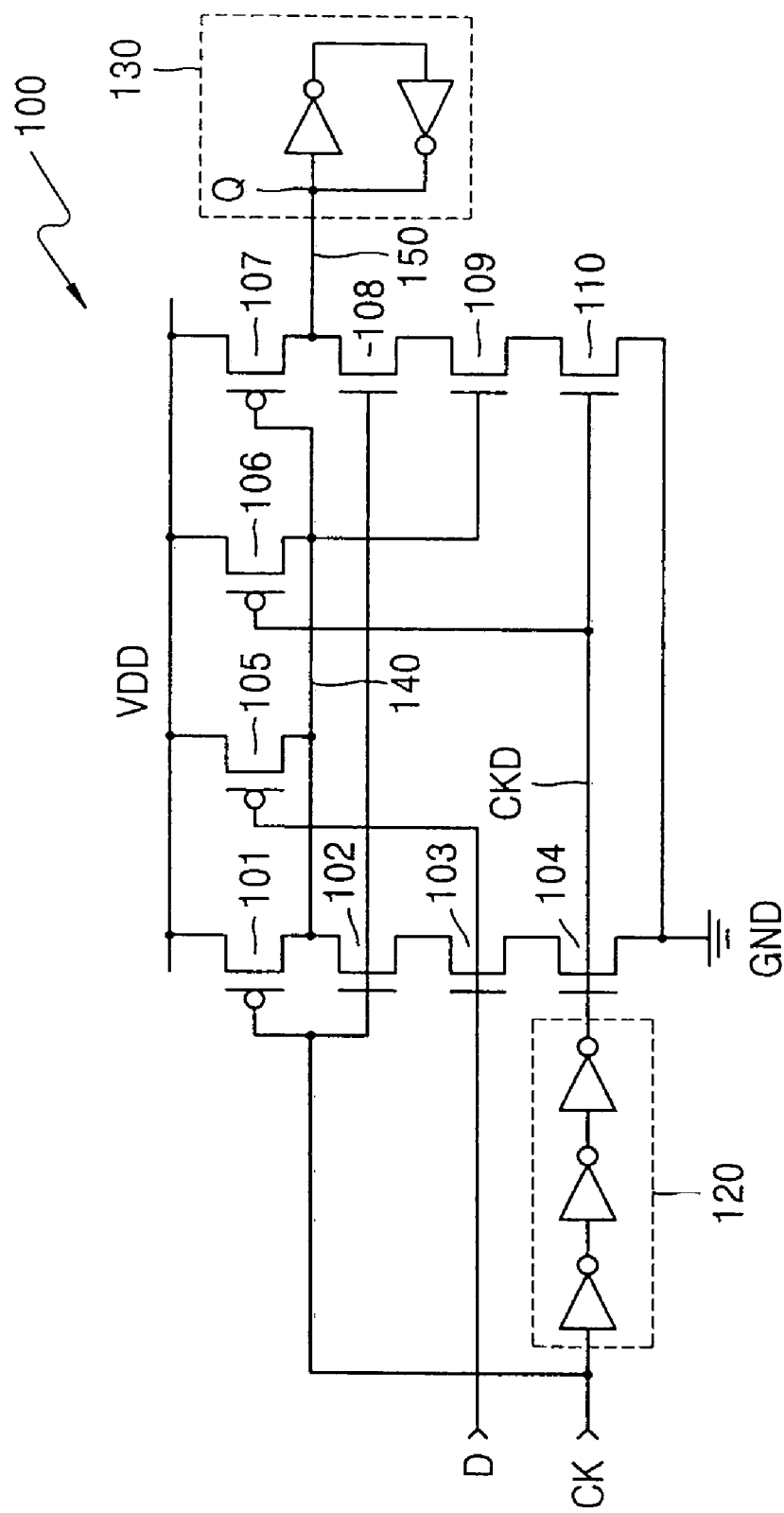
FIG. 1 is a circuit diagram of a conventional CMOS hybrid-latch flip-flop.

The operation of MTCMOS hybrid-latch flip-flop 500 in active mode is similar to that of CMOS hybrid-latch flip-flop 100 shown in FIG. 1. Thus, a description thereof will be omitted.

Figure 6:
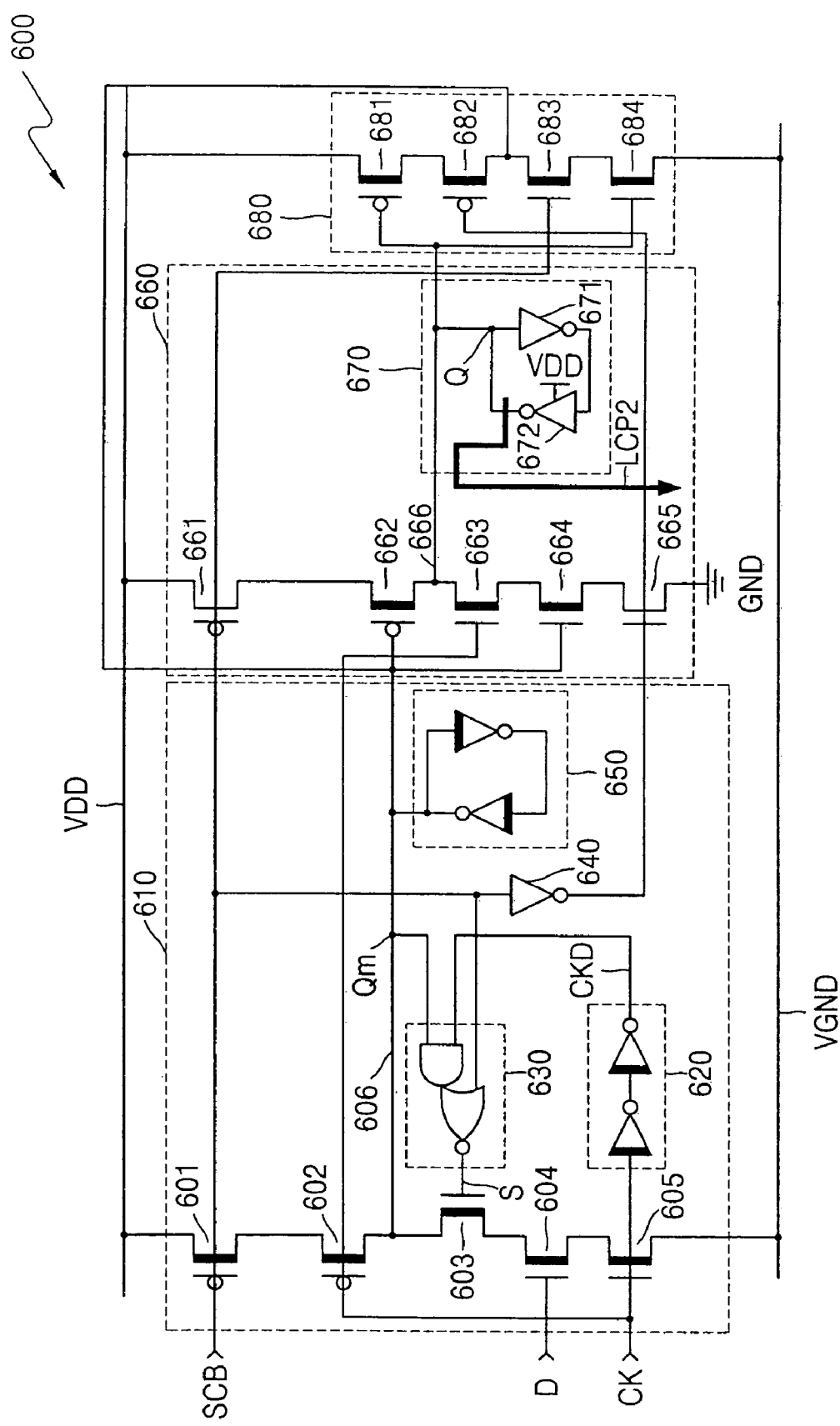
FIG. 6 is a circuit diagram of a MTCMOS flip-flop according to another embodiment of the present invention.

FIG. 6 is a circuit diagram of a MTCMOS flip-flop according to another embodiment of the present invention. The MTCMOS flip-flop shown in FIG. 6 is a MTCMOS semi-dynamic flip-flop. Referring to FIG. 6, a MTCMOS semi-dynamic flip-flop 600 includes a first stage 610 and a second stage 660, referred to as front and back stages, respectively.

First stage 610 charges or discharges an internal node 606 in response to input data signal "D", clock signal CK, and sleep signal SCB activated in sleep mode, and stores a signal "Qm" apparent at internal node 606. First stage 610 includes a charge path to charge internal node 606 to logic level "high", a discharge path to discharge internal node 606 to logic level "low", and a controller 630.

The charge path includes a first leakage break transistor 601 inactivating (i.e., breaking) the charge path in response to sleep signal SCB being activated. First leakage break transistor 601 comprises a PMOS transistor having the low threshold voltage and has a terminal connected to real power supply voltage VDD. First leakage break transistor 601 is turned off when sleep signal SCB is activated, thereby breaking the leakage current path during sleep mode. The charge path is connected between first leakage break transistor 601 and internal node 606 and further includes a PMOS transistor 602 gated with clock signal CK. PMOS transistor 602 has the low threshold voltage.

Controller 630 generates a control signal "S" to control activation or inactivation of the discharge path in response to signal "Qm", a delayed clock signal CKD, and sleep signal SCB. Controller 630 includes an AND gate and a NOR gate. The AND gate performs an AND operation on signal "Qm" and delayed clock signal CKD. The NOR gate performs a NOR operation on an output signal of the AND gate and sleep signal SCB, thereby generating control signal "S".

The discharge path includes a second leakage break transistor 603 inactivating the discharge path in response to control signal "S". Second leakage break transistor 603 comprises a NMOS transistor having the low threshold voltage and has a terminal connected to internal node 606. In sleep mode, the NOR gate of controller 630 outputs control signal "S" at logic level "low" in response to sleep signal SCB being at logic level "high", and therefore, second leakage break transistor 603 is turned off. Accordingly, the leakage current path is broken during sleep mode. As a result, an internal data signal, i.e., signal "Qm", is retained by an internal latch unit 650. Consequently, an output data signal "Q" is retained.

The discharge path is connected between second leakage break transistor 603 and virtual ground voltage VGND and further comprises NMOS transistors 604 and 605 gated with input data signal "D" and clock signal CK, respectively. NMOS transistors 604 and 605 have the low threshold voltage.

First stage 610 further includes a clock delay unit 620, an inverter 640, and internal latch unit 650. Clock delay unit 620 includes inverters connected in series. Each of the inverters includes transistors (not shown) having the low threshold voltage. Clock delay unit 620 delays clock signal CK, thereby generating delayed clock signal CKD. Inverter 640 inverts sleep signal SCB and includes transistors (not shown) having the high threshold voltage. Internal latch unit 650 stores signal "Qm" and includes cross-coupled inverters. Each of the cross-coupled inverters includes transistors (not shown) having the low threshold voltage.

Second stage 660 charges or discharges an output node 666 in response to signal "Qm", clock signal CK, sleep signal SCB, and an inverted sleep signal, and stores output data signal "Q", which is apparent at output node 666. Second stage 660 includes a charge path for charging output node 666 to logic level "high", a discharge path for discharging output node 666 to logic level "low", and a data feedback unit 680.

The charge path includes a first leakage break transistor 661 inactivating (i.e., breaking) the charge path while sleep signal SCB is activated. First leakage break transistor 661 comprises a PMOS transistor having the high threshold voltage and has a terminal connected to real power supply voltage VDD. First leakage break transistor 661 is turned off whenever sleep signal SCB is at logic level "high" in sleep mode, thereby breaking the leakage current path during sleep mode. The charge path is connected between first leakage break transistor 661 and output node 666 and further includes a PMOS transistor 662 gated with signal "Qm". PMOS transistor 662 has the low threshold voltage.

The discharge path includes a second leakage break transistor 665 inactivating (i.e., breaking) the discharge path in response to the inverted sleep signal being activated. Second leakage break transistor 665 includes a NMOS transistor having the high threshold voltage and has a terminal connected to the real ground voltage GND. Second leakage break transistor 665 is turned on or off in response to an output signal of inverter 640, which inverts sleep signal SCB. Therefore, where sleep signal SCB has a logic level "high", the leakage current path is broken during sleep mode.

The discharge path is connected between output node 666 and second leakage break transistor 665 and further includes NMOS transistors 663 and 664 gated with clock signal CK and signal "Qm", respectively. NMOS transistors 663 and 664 have the low threshold voltage.

Data feedback unit 680 includes a first PMOS transistor 681, a second PMOS transistor 682, a first NMOS transistor 683, and a second NMOS transistor 684. First PMOS transistor 681 has a source connected to real power supply voltage VDD and a gate connected to output data signal "Q", which is apparent at output node 666. Second PMOS transistor 682 has a source connected to a drain of first PMOS transistor 681, a gate through which the inverted sleep signal is input, and a drain connected to internal node 606. First NMOS transistor 683 has a drain connected to the drain of second PMOS transistor 682 and a gate through which sleep signal SCB is input. Second NMOS transistor 684 has a drain connected to a source of first NMOS transistor 683, a gate connected to output data signal "Q", and a source connected to virtual ground voltage VGND.

In sleep mode, data feedback unit 680 restores signal "Qm" in response to output data signal "Q", the inverted sleep signal, and sleep signal SCB. In other words, second PMOS transistor 682 and first NMOS transistor 683 in data feedback unit 680 are turned on in sleep mode. Then, first PMOS transistor 681 and second NMOS transistor 684 invert output data signal "Q" and provide the inverted output data signal to internal node 606. As a result, data feedback unit 680 restores a logic level of internal node 606, which sometimes floats in sleep mode, thereby preventing internal node 606 from changing logic level when a switch from sleep mode to active mode is performed. On the other hand, in active mode, second PMOS transistor 682 and first NMOS transistor 683 are turned off in response to sleep signal SCB being at logic level "low", and therefore, data feedback unit 680 does not operate.

Second stage 660 further includes an output latch unit 670 storing output data signal "Q" apparent at output node 666. Output latch unit 670 includes cross-coupled inverters 671 and 672, each of which includes transistors (not shown) having the high threshold voltage to break the leakage current path during sleep mode.

In FIG. 6, LCP2 denotes an example of the leakage current path that is broken during sleep mode. LCP2 is a sneak leakage current path connecting real power supply voltage VDD to real ground voltage GND via a PMOS transistor (not shown) included in inverter 672 and NMOS transistors 663, 664, and 665 where output data signal "Q" is at logic level "high". Sneak leakage current path LCP2 is readily broken by second leakage break transistor 665.

As described above, MTCMOS semi-dynamic flip-flop 600 turns off leakage break transistors 601, 603, 661, and 665 using sleep signal SCB to break the leakage current path during sleep mode, thereby retaining output data signal "Q". In addition, MTCMOS semi-dynamic flip-flop 600 includes leakage break transistors 661 and 665 having the high threshold voltage to break the leakage current path during sleep mode, thereby retaining output data signal "Q". Furthermore, MTCMOS semi-dynamic flip-flop 600 includes data feedback unit 680 restoring signal "Qm", thereby retaining output data signal "Q" where a switch from sleep mode to active mode is performed.

Figure 2:
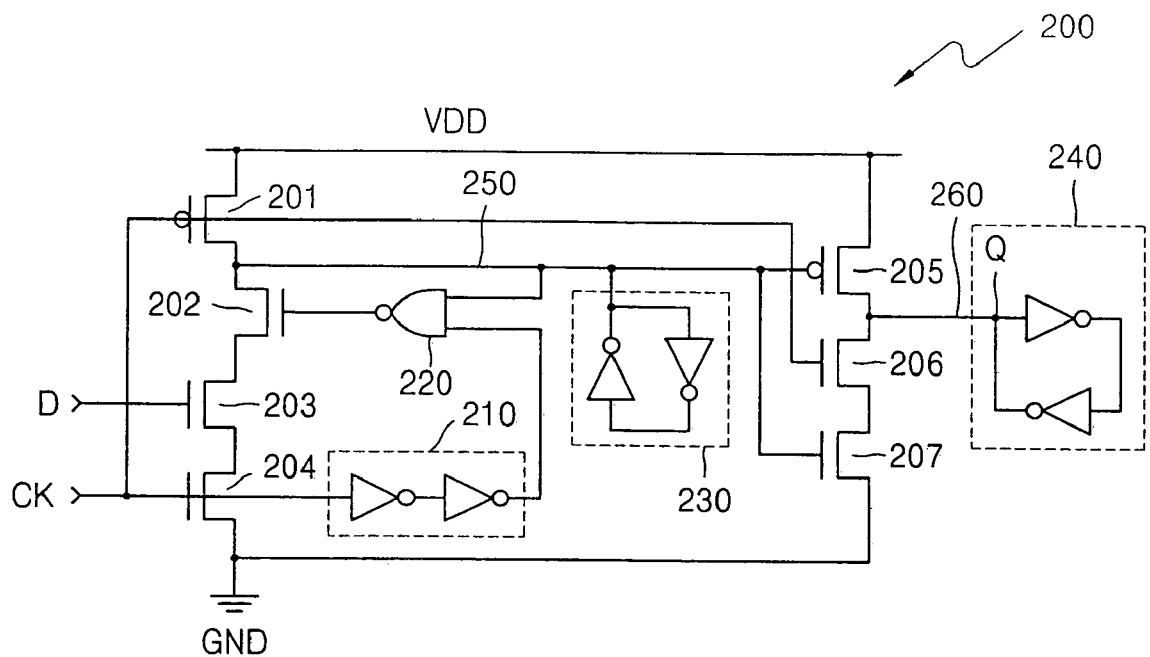
FIG. 2 is a circuit diagram of a conventional CMOS semi-dynamic flip-flop.

The operation of MTCMOS semi-dynamic flip-flop 600 in active mode is similar to that of CMOS semi-dynamic flip-flop 200 shown in FIG. 2. Thus, a description thereof will be omitted.

Figure 7:
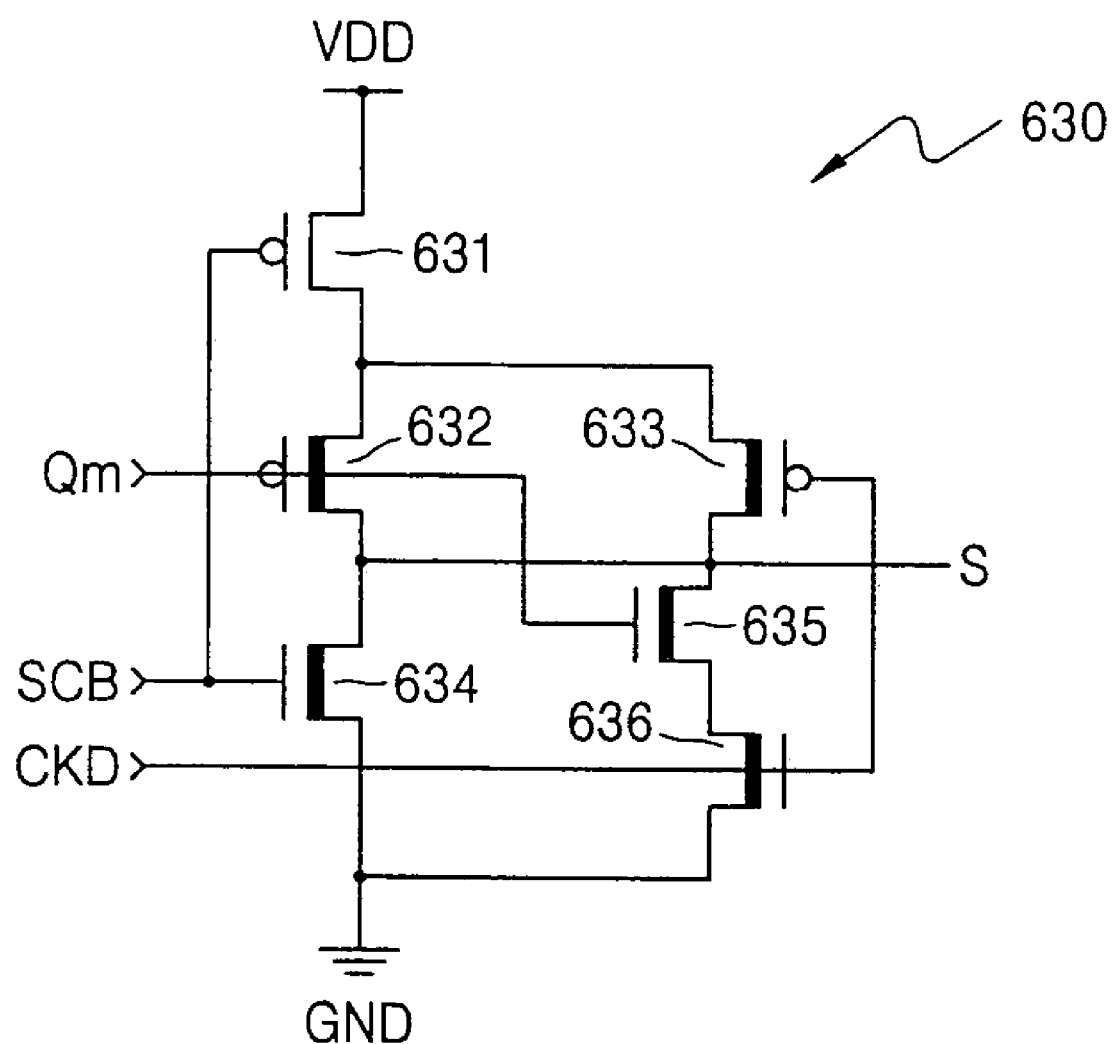
FIG. 7 is a circuit diagram of a controller shown in FIG. 6.

FIG. 7 is a circuit diagram of a controller 630 shown in FIG. 6 according to an exemplary embodiment. Referring to FIG. 7, controller 630 includes first through third PMOS transistors 631, 632, and 633 and first through third NMOS transistors 634, 635, and 636. First PMOS transistor 631 has the high threshold voltage and second and third PMOS transistors 632 and 633 and the first through third NMOS transistors 634 through 636 have the low threshold voltage.

First PMOS transistor 631 has a source connected to real power supply voltage VDD and a gate connected to sleep signal SCB. Second PMOS transistor 632 has a source connected to a drain of first PMOS transistor 631, a gate through which signal "Qm" is input, and a drain through which control signal "S" is output. Third PMOS transistor 633 has a source connected to the drain of first PMOS transistor 631, a gate through which delayed clock signal CKD is input, and a drain through which control signal S is output.

First NMOS transistor 634 has a drain connected to the drain of second PMOS transistor 632, a gate connected to sleep signal SCB, and a source connected to real ground voltage GND. Second NMOS transistor 635 has a drain connected to the drain of third PMOS transistor 633 and a gate connected to signal "Qm". Third NMOS transistor 636 has a drain connected to a source of second NMOS transistor 635, a gate connected to delayed clock signal CKD, and a source connected to real ground voltage GND.

In sleep mode, controller 630 generates control signal "S" at logic level "low" in response to sleep signal SCB being at logic level "high". In active mode, controller 630 generates control signal S at logic level "low" or logic level "high" in response to sleep signal SCB being at logic level "low", signal "Qm", and delayed clock signal CKD.

Figure 8:
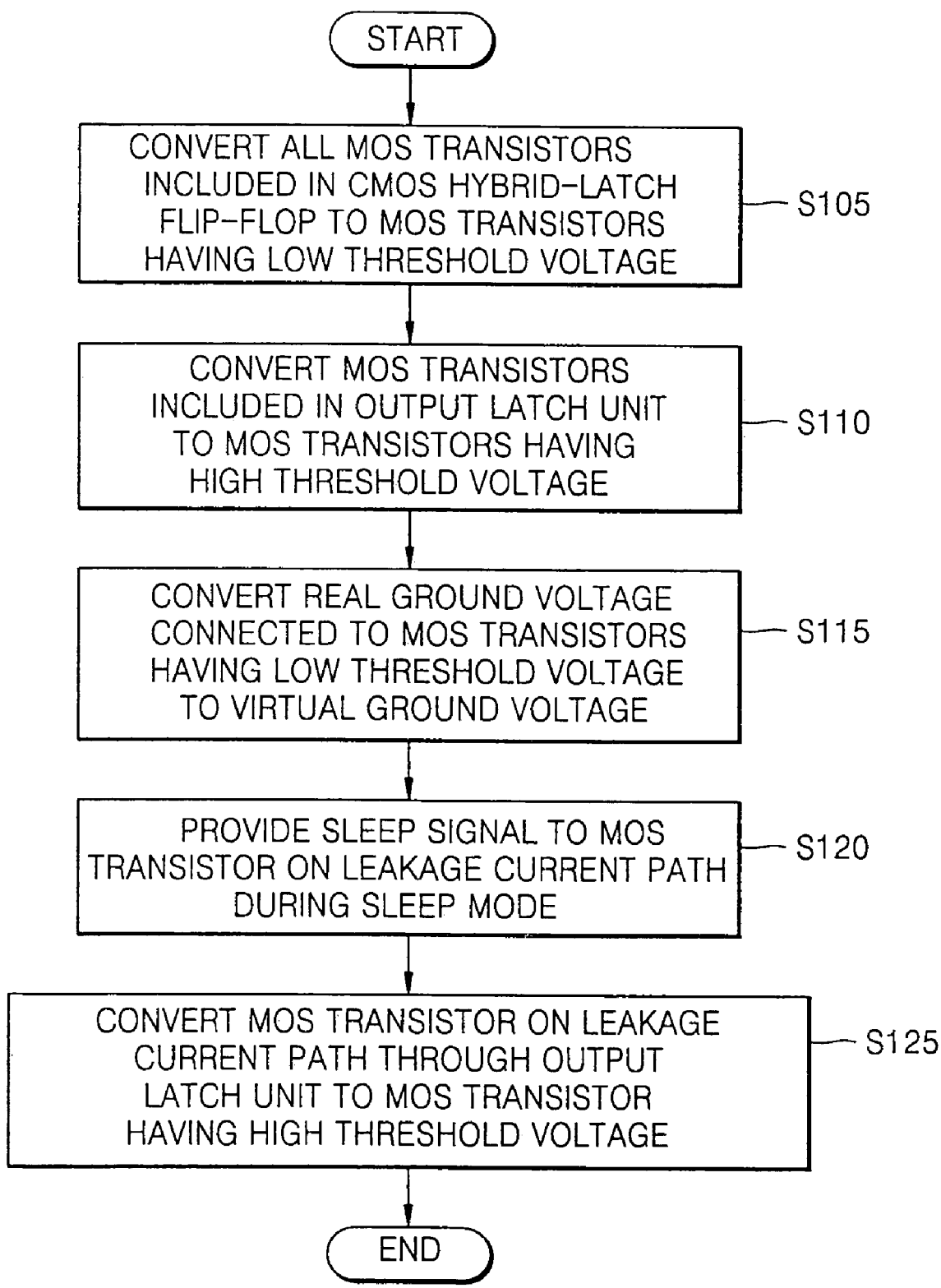
FIG. 8 is a flowchart illustrating a method of forming a MTCMOS flip-flop using a CMOS flip-flop according to one embodiment of the present invention; and, FIG. 9 is a flowchart illustrating a method of forming a MTCMOS flip-flop using a CMOS flip-flop according to another embodiment of the present invention.

FIG. 8 is a flowchart illustrating a method of forming a MTCMOS flip-flop using a CMOS flip-flop according to an embodiment of the present invention. More specifically, FIG. 8 is a flowchart illustrating a method of forming a MTCMOS flip-flop from a CMOS hybrid-latch flip-flop.

All MOS transistors included in the CMOS hybrid-latch flip-flop are converted to MOS transistors having the low threshold voltage in an operation S105. MOS transistors included in an output latch unit of the CMOS hybrid-latch flip-flop are converted to MOS transistors having the high threshold voltage in an operation S110. In particular, the MOS transistors included in cross-coupled inverters of the output latch unit are converted to MOS transistors having the high threshold voltage. The real ground voltage connected to the MOS transistors having the low threshold voltage is converted to the virtual ground voltage in an operation S115.

To break a leakage current path during sleep mode, the sleep signal activated in sleep mode is provided to a MOS transistor on the leakage current path in an operation S120. A MOS transistor on a leakage current path through the output latch unit in sleep mode is converted to a MOS transistor having the high threshold voltage in an operation S125. A terminal of the MOS transistor having the high threshold voltage is connected to the real ground voltage. Operation S125 is performed to break the sneak leakage current path in the MTCMOS hybrid-latch flip-flop, thereby retaining an output data signal stored in the output latch unit.

The above-described method of forming a MTCMOS hybrid-latch flip-flop from a CMOS hybrid-latch flip-flop is readily used as a schematic tool for designing a semiconductor integrated circuit.

Figure 9:
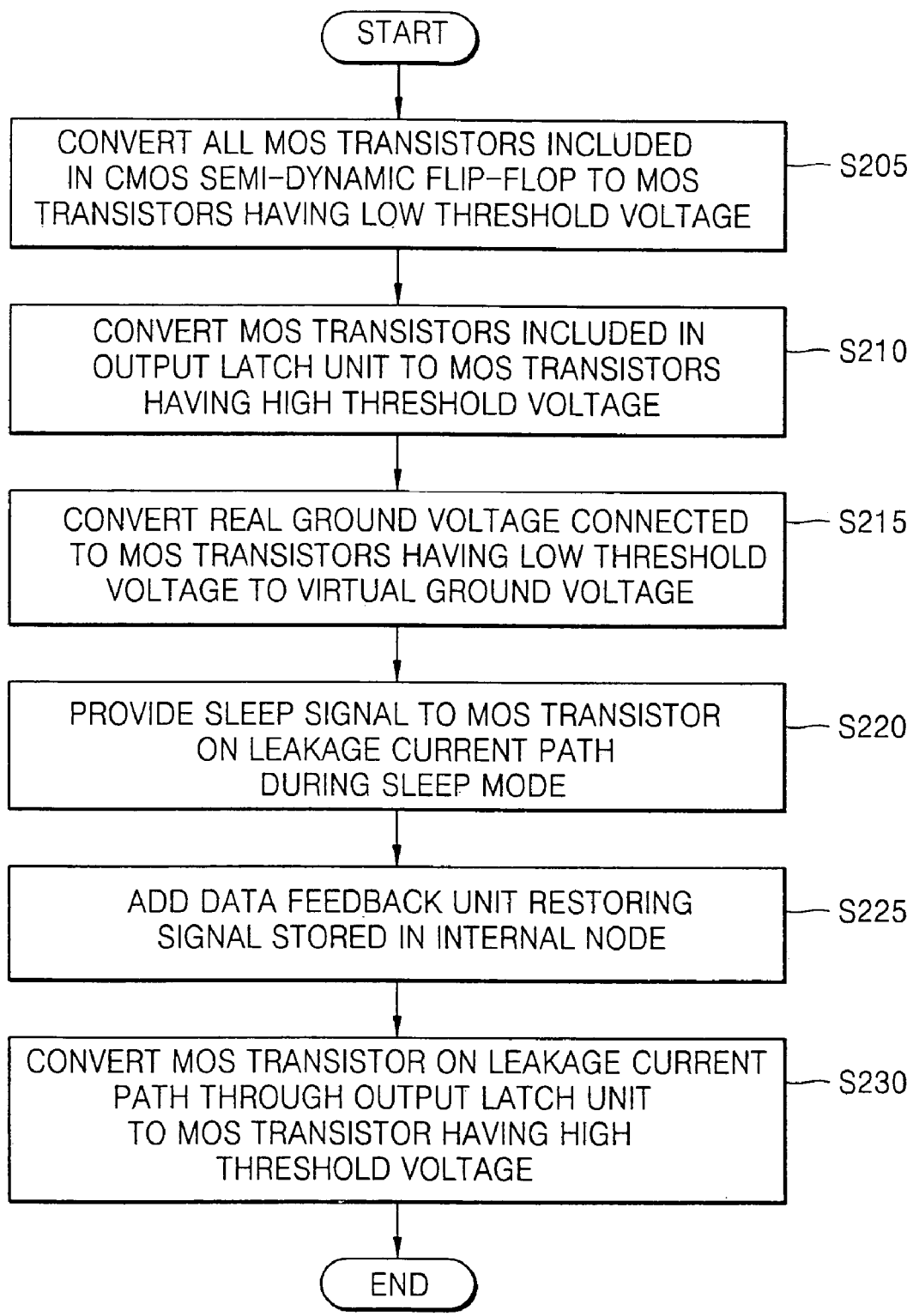

FIG. 9 is a flowchart illustrating a method of forming a MTCMOS flip-flop using a CMOS flip-flop according to another embodiment of the present invention. More particularly, FIG. 9 illustrates a method of forming MTCMOS semi-dynamic flip-flop from a CMOS semi-dynamic flip-flop.

All MOS transistors included in the CMOS semi-dynamic flip-flop are converted to MOS transistors having the low threshold voltage in an operation S205. MOS transistors included in an output latch unit of the CMOS semi-dynamic flip-flop are converted to MOS transistors having the high threshold voltage in an operation S210. In particular, the MOS transistors included in cross-coupled inverters of the output latch unit are converted to MOS transistors having the high threshold voltage. The real ground voltage connected to the MOS transistors having the low threshold voltage is converted to the virtual ground voltage in an operation S215. To break a leakage current path during sleep mode, the sleep signal activated in sleep mode is provided to a MOS transistor on the leakage current path in an operation S220.

A special circuit such as a data feedback unit is typically added in an operation S225. The data feedback unit restores a signal stored in an internal node. The internal node is connected to an internal latch unit using a signal stored in an output node connected to the output latch unit. The data feedback unit typically inverts the signal stored in the output node to restore the signal stored in the internal node. Accordingly, the data feedback unit prevents floating of the internal node that that is sometimes included in the leakage current that occurs in sleep mode.

A MOS transistor on a leakage current path through the output latch unit is converted to a MOS transistor having the high threshold voltage in an operation S230. A terminal of the MOS transistor having the high threshold voltage is connected to the real ground voltage. Operation S230 is performed to break the sneak leakage current path in the MTCMOS semi-dynamic flip-flop, thereby retaining an output data signal stored in the output latch unit.

The above-described method of forming a MTCMOS semi-dynamic flip-flop from a CMOS semi-dynamic flip-flop can be used for a schematic tool for designing a semiconductor integrated circuit.

Methods of forming a MTCMOS hybrid-latch flip-flop and MTCMOS semi-dynamic flip-flop from a CMOS hybrid-latch flip-flop and a CMOS semi-dynamic flip-flop, respectively, have been described with reference to FIGS. 8 and 9. Those skilled in the art will understand that the method of forming a MTCMOS flip-flop according to the present invention is readily applied to other types of CMOS flip-flops.

All of the foregoing exemplary embodiments are teaching examples. Those of ordinary skill in the art will understand that various changes in form and details may be made to the exemplary embodiments without departing from the scope of the present invention which is defined by the following claims.

What is claimed is:

1. A multi-threshold voltage complementary metal oxide semiconductor (MTCMOS) flip-flop comprising:
    a first stage charging or discharging an internal node in response to an input data signal, a clock signal, and a sleep signal activated in a sleep mode; and, a second stage charging or discharging an output node in response to a signal apparent at the internal node, the clock signal, and a combination of the clock signal and the sleep signal, and storing an output data signal generated by charging or discharging the output node;

wherein the first stage comprises:

a clock delay unit delaying the clock signal in an active mode;

a first leakage break transistor comprising a NMOS transistor having a low threshold voltage, being connected to a virtual ground, being gated by an output signal from the clock delay unit, and being turned off in response to an activated sleep signal, thereby breaking a leakage current path during sleep mode;

a first charge path charging the internal node to a logic level "high"; and, a first discharge path discharging the internal node to a logic level "low", wherein the first discharge path comprises the first leakage break transistor inactivating the first discharge path in response to the output signal of the clock delay unit in sleep mode;

wherein the second stage comprises an output latch unit storing the output data signal;

wherein the output latch unit comprises cross-coupled inverters; and, wherein each of the cross-coupled inverters comprises a transistor having a high threshold voltage.

2. The MTCMOS flip-flop of claim 1, wherein the first stage is connected between a real power supply voltage and a virtual ground voltage.

3. The MTCMOS flip-flop of claim 1, wherein the second stage is connected between a real power supply voltage and a real ground voltage.

4. A multi-threshold voltage complementary metal oxide semiconductor (MTCMOS) flip-flop comprising:

a first stage charging or discharging an internal node in response to an input data signal, a clock signal, and a sleep signal activated in a sleep mode;

a second stage charging or discharging an output node in response to a signal apparent at the internal node, the clock signal, and a combination of the clock signal and the sleep signal, and storing an output data signal generated by charging or discharging the output node;

a clock delay unit delaying the clock signal in an active mode;

wherein the first stage or the second stage comprises a first leakage break transistor gated by an output signal of the crock delay unit in sleep mode and turned off in response to an activated sleep signal, thereby breaking a leakage current path during sleep mode;

wherein the clock delay unit is responsive to the clock signal and the sleep signal and comprises:

a first inverter inverting the clock signal;

a second inverter inverting an output signal of the first inverter; and, a NOR gate performing a NOR operation on an output signal of the second inverter and the sleep signal; and, wherein the first and second inverters comprise transistors having a low threshold voltage, and the NOR gate comprises a transistor having a high threshold voltage.

5. The MTCMOS flip-flop of claim 1, wherein the first charge path comprises:

a first PMOS transistor having a source connected to a real power supply voltage, a gate connected to the clock signal, and a drain connected to the internal node;

a second PMOS transistor connected in parallel with the first PMOS transistor and having a gate connected to the input data signal; and, a third PMOS transistor connected in parallel with the second PMOS transistor and having a gate connected to the output signal of the clock delay unit;

wherein the first through third PMOS transistors have the low threshold voltage.

6. The MTCMOS flip-flop of claim 5, wherein the first discharge path further comprises:

a first NMOS transistor having a drain connected to the internal node and a gate through which the clock signal is input; and, a second NMOS transistor connected between the first NMOS transistor and the first leakage break transistor and having a gate connected to the input data signal;

wherein the first and second NMOS transistors have the low threshold voltage.

7. The MTCMOS flip-flop of claim 1, wherein the second stage further comprises:

a second charge path charging the output node to a logic level "high"; and, a second discharge path discharging the output node to a logic level "low"; and, wherein the second charge path comprises a second leakage break transistor gated with a signal apparent at the internal node;

the second discharge path comprises a third leakage break transistor inactivating the second discharge path in response to the output signal of the clock delay unit in sleep mode;

the second leakage break transistor comprises a PMOS transistor having the high threshold voltage;

the third leakage break transistor comprises a NMOS transistor having the high threshold voltage;

terminals of the second leakage break transistor are connected to a real power supply voltage and the output node, respectively; and, a terminal of the third leakage break transistor is connected to a real ground voltage.

8. The MTCMOS flip-flop of claim 7, wherein the second discharge path further comprises:

a first NMOS transistor having a drain connected to the output node and gated with the clock signal; and, a second NMOS transistor connected between the first NMOS transistor and the third leakage break transistor and gated with the signal apparent at the internal node; and, wherein the first and second NMOS transistors have the low threshold voltage.

9. Presented) The MTCMOS flip-flop of claim 4, wherein the second stage comprises an output latch unit storing the output data signal; and, wherein the output latch unit comprises cross-coupled inverters; and, each of the cross-coupled inverters comprises a transistor having a high threshold voltage.

10. The MTCMOS flip-flop of claim 9, wherein the second stage further comprises:

a charge path charging the output node to a logic level "high"; and, a discharge path discharging the output node to a logic level "low"; and, wherein the charge path comprises a second leakage break transistor gated with a signal apparent at the internal node;

the discharge path comprises the first leakage break transistor inactivating the discharge path in response to the output signal of the clock delay unit in sleep mode;

the second leakage break transistor comprises a PMOS transistor having the high threshold voltage;

the first leakage break transistor comprises a NMOS transistor having the high threshold voltage;

terminals of the second leakage break transistor are connected to a real power supply voltage and the output node, respectively; and, a terminal of the first leakage break transistor is connected to a real ground voltage.

11. The MTCMOS flip-flop of claim 10, wherein the discharge path further comprises:

a first NMOS transistor having a drain connected to the output node and gated with the clock signal; and, a second NMOS transistor connected between the first NMOS transistor and the first leakage break transistor and gated with the signal apparent at the internal node; and, wherein the first and second NMOS transistors have the low threshold voltage.

12. The MTCMOS flip-flop of claim 4, wherein the first stage is connected between a real power supply voltage and a virtual ground voltage.

13. The MTCMOS flip-flop of claim 4, wherein the second stage is connected between a real power supply voltage and a real ground voltage.

14. A multi-threshold voltage complementary metal oxide semiconductor (MTCMOS) flip-flop comprising:

a first stage charging or discharging an internal node in response to an input data signal, a clock signal, and a sleep signal activated in a sleep mode; and, a second stage comprising:

a first transistor arranged in a first charge path allowing an output node to be charged in response to a signal apparent at the internal node, a plurality of second transistors arranged in a first discharge path allowing the output node to be discharged in response to the signal apparent at the internal node, the clock signal, and a combination of the clock signal and the sleep signal, wherein the second stage stores an output data signal generated by charging or discharging the output node, and wherein one of the second transistors is a leakage break transistor having a threshold voltage relatively higher than a threshold voltage for other transistors in the plurality of second transistors and being turned off in response to an activated sleep signal to thereby break a leakage current path associated with the output node.

15. The MTCMOS flip-flop of claim 14, wherein the first stage is connected between a real power supply voltage and a virtual ground voltage.

16. The MTCMOS flip-flop of claim 14, wherein the second stage is connected between a real power supply voltage and a real ground voltage.

17. The MTCMOS flip-flop of claim 14, wherein the first stage comprises a second charge path comprising:

a first PMOS transistor having a source connected to a real power supply voltage, a gate connected to the clock signal, and a drain connected to the internal node;

a second PMOS transistor connected in parallel with the first PMOS transistor and having a gate connected to the input data signal; and, a third PMOS transistor connected in parallel with the second PMOS transistor;

wherein the first through third PMOS transistors have the low threshold voltage.

18. The MTCMOS flip-flop of claim 17, wherein another one of the second transistors is a first NMOS transistor having a drain connected to the internal node and a gate through which the clock signal is input; and, still another one of the second transistors is a second NMOS transistor connected between the first NMOS transistor and the leakage break transistor and having a gate connected to the input data signal;

wherein the first and second NMOS transistors have the low threshold voltage.

19. The MTCMOS flip-flop of claim 14, wherein the second stage comprises an output latch unit storing the output data signal; and, wherein the output latch unit comprises cross-coupled inverters; and, each of the cross-coupled inverters comprises a transistor having a high threshold voltage.

20. The MTCMOS flip-flop of claim 19, wherein another one of the second transistors is a first NMOS transistor having a drain connected to the output node and gated with the clock signal; and, still another one of the second transistors is a second NMOS transistor connected between the first NMOS transistor and the second leakage break transistor and gated with the signal apparent at the internal node; and, wherein the first and second NMOS transistors have the low threshold voltage.

21. A multi-threshold voltage complementary metal oxide semiconductor (MTCMOS) flip-flop comprising:

a clock delay unit delaying a clock signal in an active mode in which a sleep signal is inactivated and being inactivated in a sleep mode in which the sleep signal is activated;

a first stage charging or discharging an internal node in response to an input data signal, the clock signal, and an output signal of the clock delay unit; and, a second stage charging or discharging an output node in response to a signal apparent at the internal node, the clock signal, and the output signal of the clock delay unit, and storing an output data signal generated by charging or discharging the output node, the second stage comprising:

a first transistor arranged in a first charge path allowing an output node to be charged in response to a signal apparent at the internal node, a plurality of second transistors arranged in a first discharge path allowing the output node to be discharged in response to the signal apparent at the internal node, the clock signal, and a combination of the clock signal and the sleep signal, and wherein one of the second transistors is a first leakage break transistor having a threshold voltage relatively higher than a threshold voltage for other transistors in the plurality of second transistors and being turned off in response to an activated sleep signal to thereby break a leakage current path associated with the output node.

22. The MTCMOS flip-flop of claim 21, wherein the first stage is connected between a real power supply voltage and a virtual ground voltage.

23. The MTCMOS flip-flop of claim 21, wherein the second stage is connected between a real power supply voltage and a real ground voltage.

24. The MTCMOS flip-flop of claim 21, wherein the first leakage break transistor is gated with the output signal of the clock delay unit in sleep mode.

25. The MTCMOS flip-flop of claim 24, wherein the clock delay unit responds to the clock signal and the sleep signal and comprises:
- a first inverter inverting the clock signal;
- a second inverter inverting an output signal of the first inverter; and,
- a NOR gate performing a NOR operation on an output signal of the second inverter and the sleep signal.

26. The MTCMOS flip-flop of claim 24, wherein the first stage comprises a charge path comprising:
- a first PMOS transistor having a source connected to a real power supply voltage, a gate connected to the clock signal, and a drain connected to the internal node;
- a second PMOS transistor connected in parallel with the first PMOS transistor and having a gate connected to the input data signal; and,
- a third PMOS transistor connected in parallel with the second PMOS transistor and having a gate connected to the output signal of the clock delay unit;
- wherein the first through third PMOS transistors have a low threshold voltage.

27. The MTCMOS flip-flop of claim 26, wherein the first stage comprises a discharge path comprising:
- a first NMOS transistor having a drain connected to the internal node and a gate through which the clock signal is input; and,
- a second NMOS transistor connected between the first NMOS transistor and a second leakage break transistor and having a gate connected to the input data signal;
- wherein the first and second NMOS transistors have the low threshold voltage.

28. The MTCMOS flip-flop of claim 24, wherein the second stage comprises an output latch unit storing the output data signal; and,
- wherein the output latch unit comprises cross-coupled inverters; and,
- each of the cross-coupled inverters comprises a transistor having a high threshold voltage.

29. The MTCMOS flip-flop of claim 28, wherein the second stage comprises a discharge path comprising:
- a first NMOS transistor having a drain connected to the output node and gated with the clock signal; and,
- a second NMOS transistor connected to the first NMOS transistor and gated with the signal apparent at the internal node; and,
- wherein the first and second NMOS transistors have a low threshold voltage.

30. The MTCMOS flip-flop of claim 1, wherein, when the sleep signal is activated, a logic level of the input data signal does not affect a logic level of the output data signal apparent at the output node.

31. The MTCMOS flip-flop of claim 4, wherein, when the sleep signal is activated, a logic level of the input data signal does not affect a logic level of the output data signal apparent at the output node.

32. The MTCMOS flip-flop of claim 14, wherein, when the sleep signal is activated, a logic level of the input data signal does not affect a logic level of the output data signal apparent at the output node.

* * * * *